United States Patent
Tanabe

(10) Patent No.: US 10,247,790 B2
(45) Date of Patent: Apr. 2, 2019

(54) MAGNETIC SENSOR

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 28 days.

(21) Appl. No.: 15/069,189

(22) Filed: Mar. 14, 2016

(65) Prior Publication Data

US 2016/0266219 A1 Sep. 15, 2016

(30) Foreign Application Priority Data

Mar. 12, 2015 (JP) .................. 2015-049727
Feb. 17, 2016 (JP) .................. 2016-027515

(51) Int. Cl.
*G01R 33/09* (2006.01)
*G01R 33/00* (2006.01)

(52) U.S. Cl.
CPC ....... *G01R 33/093* (2013.01); *G01R 33/0005* (2013.01)

(58) Field of Classification Search
CPC .... B64G 1/366; G01R 33/028; G01R 33/038; G01R 33/1215; G01R 33/09; G01R 1/26; G11B 2005/0016; G11B 2005/3996; Y10T 428/1107; G01N 2201/0438; G04C 5/00; G05B 2219/37124; G05B 2219/37133
USPC .......... 324/252, 207.21, 244, 207.24, 207.25
See application file for complete search history.

(56) References Cited

U.S. PATENT DOCUMENTS

| | | | | |
|---|---|---|---|---|
| 6,034,847 A | * | 3/2000 | Komuro | B82Y 10/00 360/125.44 |
| 2003/0155909 A1 | | 8/2003 | Steinruecken et al. | |
| 2010/0072992 A1 | * | 3/2010 | Bauer | B82Y 25/00 324/260 |
| 2010/0301835 A1 | * | 12/2010 | Kasajima | G01R 15/207 324/117 R |
| 2011/0074406 A1 | * | 3/2011 | Mather | B82Y 25/00 324/252 |
| 2011/0221436 A1 | * | 9/2011 | Ichinohe | G01R 15/205 324/252 |
| 2012/0200292 A1 | * | 8/2012 | Sugihara | B82Y 25/00 324/252 |

(Continued)

FOREIGN PATENT DOCUMENTS

JP  5500785 B2  5/2014
JP  5597206 B2  10/2014

*Primary Examiner* — Tung X Nguyen
*Assistant Examiner* — Robert P Alejnikov, Jr.
(74) *Attorney, Agent, or Firm* — Oliff PLC

(57) ABSTRACT

The present invention relates to a magnetic sensor which can detect a weak magenetic field and improve the detection precision with an easy and convenient configuration. A magnetic sensor is provided with a magnetic body changing the direction of a magnetic field input to a magnetoresistance effect element in the vicinity of the magnetoresistance effect element in which the resistance value changes according to the direction of the input magnetic field, the magnetic body has at leas one projection portion in the direction almost parallel to direction in which the magnetic induction occurs in the magnetoresistance effect element. The direction in which the projection portion of the magnetic body projects is substantially parallel to the direction in which the magnetization of the magnetoresistance effect element is fixed.

16 Claims, 14 Drawing Sheets

(56) References Cited

U.S. PATENT DOCUMENTS

2014/0159717 A1\* 6/2014 Paci ................... G01R 33/0011
                                                                           324/252

\* cited by examiner

<Magnetic flux in GMR element part from example of prior art>

<Configuration of the sensor from Embodiment 1 (plane invovling X-Z axis)>

<Configuration of the sensor from Embodiment 1 (plane invovling X-Y axis)>

<Magnetic flux in GMR element part from Embodiment 1>

<Configuration of the sensor from Embodiment 2 (plane involving X-Y axis)>

<Magnetic flux in GMR element part from Embodiment 2>

<Configuration of the sensor from Embodiment 3 (plane invovling X-Y axis)>

<Magnetic flux in GMR element part from Embodiment 3>

<Configuration of the sensor from Embodiment 4 (plane invovling X-Y axis)>

<Magnetic flux in GMR element part from Embodiment 4>

<Configuration of the sensor from Embodiment 5 (plane invovling X-Z axis)>

<Configuration of the sensor from Embodiment 5 (plane invovling X-Y axis)>

<Magnetic flux in GMR element part from Embodiment 5>

MAGNETIC SENSOR

The present invention relates to a magnetic sensor, especially a magnetic sensor utilizing a magnetoresistance effect element.

BACKGROUND

A magnetic sensor capable of detecting the change of the magnetic field is developed as a measuring device and used in various applications such as the galvanometer, the magnetic encoder and the like. One example of such a magnetic sensor is disclosed in the following Patent Document 1 in which a GMR element (Giant Magneto Resistive element) is used as the element for detecting the change of the magnetic field. The GMR element is a kind of element in which the output resistance value changes according to the input magnetic field, and the change of the magnetic field to be detected can be measured based on the output resistance value.

As one example showing the specific configuration of the magnetic sensor where the GMR element is used, as described in Patent Document 1, four GMR elements are provided in the substrate to form a bridge circuit. As such, the change of the resistance value in the GMR element is detected by detecting the differential voltage in the bridge circuit, wherein the change of the resistance value in the GMR element is with the change of the magnetic field which becomes a detection object. In this respect, a sensor that is highly sensitive to the change of magnetic field has been provided.

In particular, as an element to detect the change of magnetic field, a GMR chip (the chip for detecting magnetic field) is provided in the magnetic sensor as disclosed in Patent Document 1, wherein the GMR chip utilizes the spin valve typed GMR elements (Giant Magneto Resistive element) in which the output resistance value changes depending on the direction of the input magnetic field. As such, each GMR element is magnetized fixedly in a specific direction in one surface so as to detect the magnetic field in the specified direction. Here, in order to downsize the GMR chip and also to lower the deviation in each resistance value, four GMR elements which have already formed the bridge circuit are provided on one GMR chip. Thus, all four GMR elements are magnetized fixedly in the same direction.

FIG. 1 and FIG. 2 illustrate the characteristic of the GMR element. First of all, the characteristic of the GMR element used in the present invention will be described with reference to FIG. 1 and FIG. 2. The GMR element is the GMR element (Giant Magneto Resistive element) made in the spin valve type in which output resistance value changes depending on the direction of the input magnetic field. As such, in FIG. 1 and FIG. 2, the relationship between the approach angle and the resistance value is shown, wherein the approach angle refers to the angle of magnetic field H relative to the GMR element.

In the example as shown in FIG. 1, GMR elements are formed on the upper surface of GMR chip 1. The GMR elements are arranged in such a manner that they are magnetized fixedly in the direction indicated by arrow A. Thus, the magnetic field in the direction as indicated by arrow A can be detected.

In FIG. 1, the GMR elements are arranged in magnetic field H that enters in the direction perpendicular to the form surface of the GMR elements. In this respect, the resistance value of the GMR element turns to "$R_0$" as shown in FIG. 2. In contrast, if the direction of magnetic field inclines, the incidence angle of magnetic field H relative to the GMR element surface deviates from the perpendicular direction with an angle of i.e., $-\Delta\theta$ or $+\Delta\theta$, as shown in FIG. 1 with dotted lines, wherein $\Delta$ (Delta) refers to the variation. In this way, the GMR element is magnetized fixedly in one direction and the resistance value of the GMR element changes when the direction of the magnetic field changes with respect to said direction, as shown in FIG. 2. As such, the GMR element has the following characteristic. If the resistance value is defined as $R_0$ when the magnetic field enters in a perpendicular direction, the resistance value will have substantial change when the direction of the magnetic field H inclines with a tiny angle.

FIG. 3 and FIG. 4 show the configuration of the conventional magnetic sensor. When the magnetic field in one direction is detected by using a GMR chip where the bridge circuit as described above has been formed, magnetic body 21 which changes the direction of the magnetic field input to the GMR element is provided in the vicinity of the element forming part where the GMR elements in pair that are adjacent but not connected to each other in the bridge circuit are provided at almost symmetrical positions, as described in Patent Document 1.

Further, magnetic body 21 can change the external magnetic field in one direction into a different direction between the GMR elements. In this way, four GMR elements inside the bridge circuit are provided in such a manner that the magnetic field comes out in the direction in which the magnetization is fixed relative to one and comes out in the opposite direction relative to another one. As such, a high differential voltage is output from the bridge circuit, and the magnetic field in one direction can be detected in precision.

FIG. 5 is a schematic view showing the magnetic field H introduced to the GMR element parts 11 and 12 through magnetic body 21 as described in Patent Document 1. The magnetic field bends due to magnetic body 21, and the component of the magnetic field is generated in the GMR element parts 11 and 12 in the direction of the induced magnetic field (magnetic field component in the X-axis direction) and the resistance value of said GMR element changes. Thus, the sensor is provided which is highly sensitive to the change of the magnetic field. In addition, in the following description, the direction parallel to that where the GMR element is magnetized fixedly is defined as the X-axis direction, and the direction which is perpendicular to that where the GMR element is magnetized fixedly and also is located on the surface where the GMR elements are formed is defined as the Y-axis direction. Further, the direction perpendicular to the surface where the GMR elements are formed is defined as the Z-axis direction.

Patent Document 2 has disclosed a sensor in which several magnetic bodies are provided for the magnetoresistance effect element to convert the external magnetic field in the vertical direction into magnetic field component in the horizontal direction so that the component of the magnetic field entering in the vertical direction is detected.

PATENT DOCUMENTS

Patent Document 1: JP-P5500785
Patent Document 2: JP-P5597206

SUMMARY

However, in the techniques disclosed in Patent Document 1 and Patent Document 2, the following problem exists. That is, in the detection of a weak magnetic field, the intensity of the magnetic field coming out of the element part is not sufficiently large. Thus, it is necessary to improve the magnetic detection precision.

Thus, the objective of the present invention is to solve the technical problem mentioned above. That is, the present invention aims to improve the detection precision of the magnetic sensor with an easy and convenient configuration.

Here, the magnetic sensor according to one embodiment of the present invention, wherein a magnetic body which changes the direction of a magnetic field input to a magnetoresistance effect element is provided in the vicinity of the magnetoresistance effect element in which the resistance value changes according to the direction of the input magnetic field, wherein the magnetic body has at least one projection portion for introducing the magnetic field to be detected to the magnetic-resistive element effectively so as to improve the detection precision.

In addition, since the direction in which the projection portion of the magnetic body projects is substantially parallel to the direction in which the magnetization of the magnetoresistance effect element is fixed, the magnetic field to be detected is introduced to the magnetoresistance effect element effectively so that the detection precision is improved.

Preferably, the end of the magnetic body in the direction in which the projection portion projects is disposed closer to a central side of the magnetic body than the end of the magnetoresistance effect element at a side opposite to the central side of the magnetic body. Further, it is preferable that the magnetic body and the magnetoresistance effect element do not overlap in the direction perpendicular to the placement surface of the magnetoresistance effect element.

Preferably, at least a part of the projection portion of the magnetic body contacts with the placement surface of the magnetic body.

Further, the magnetic body is preferably the soft magnetic body.

According to the invention mentioned above, the detection precision of the magnetic sensor can be improved by introducing the magnetic field to be detected to the magnetoresistance effect element through the projection portion of the magnetic body.

DETAILED DESCRIPTION OF EMBODIMENTS

The specific configuration in the present invention will be described in the following embodiments. Hereinafter, the basic configuration of the magnetic sensor in the present invention will be described in Embodiment 1, and the configuration of the magnetic sensor to be specifically used in to the present invention will be described in Embodiments 2 to 5.

The GMR is described as an example of the magnetoresistance element, but the element having the magnetoresistance effect can also be used, including the TMR element, AMR element and the like.

(Embodiment 1)

Figure 1:
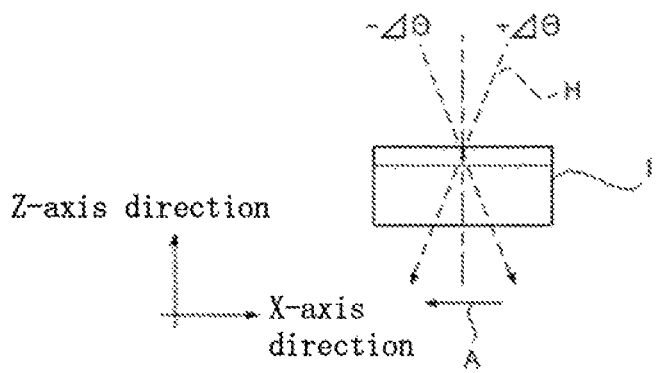
FIG. 1 is a view showing the configuration of the GMR chip.
Figure 2:
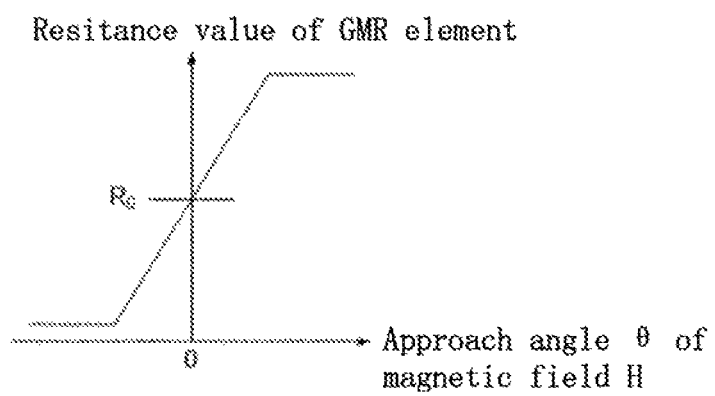
FIG. 2 is a diagram showing the characteristic of the GMR element.
Figure 3:
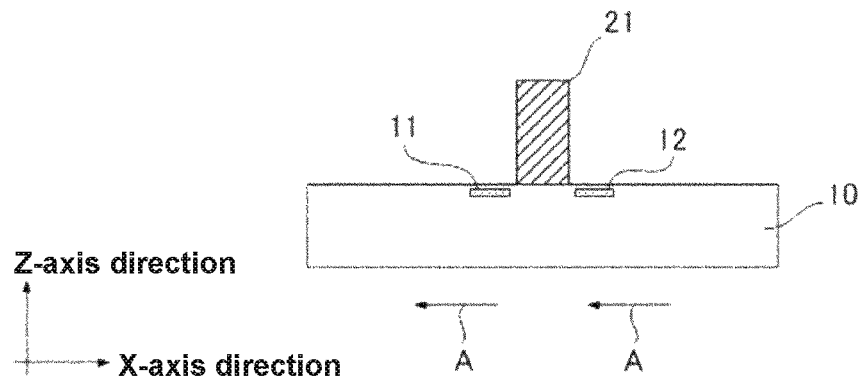
FIG. 3 is a view showing the configuration of the conventional magnetic sensor (the surface involving X-Z axis).
Figure 4:
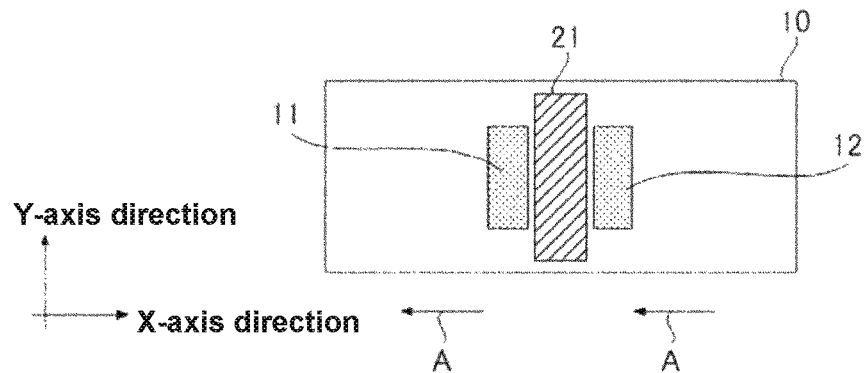
FIG. 4 is a view showing the configuration of the conventional magnetic sensor (the surface involving X-Y axis).
Figure 5:
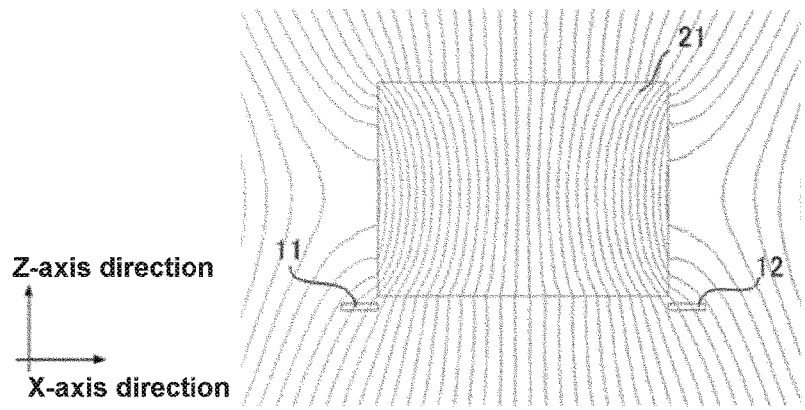
FIG. 5 is a schematic view showing the magnetic flux introduced to the GMR element part in the example of prior art.
Figure 6:
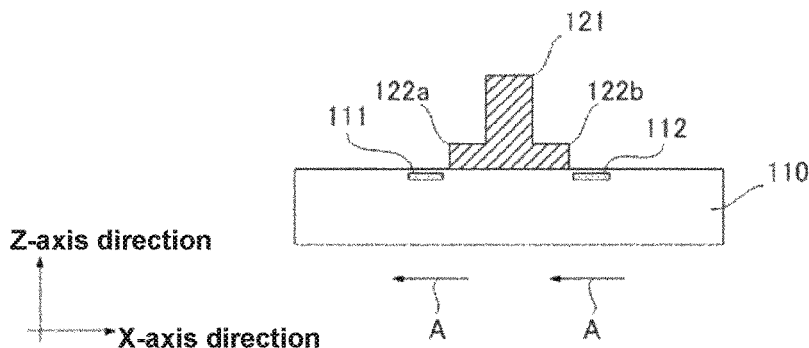
FIG. 6 is a view showing the configuration of the magnetic sensor in Embodiment 1 (the surface involving X-Z axis).
Figure 7:
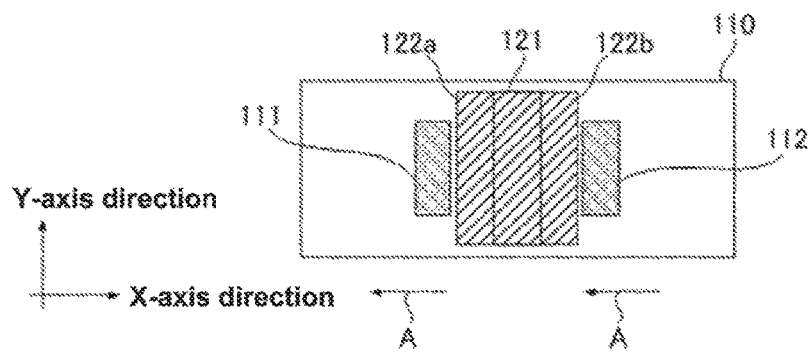
FIG. 7 is a view showing the configuration of the magnetic sensor in Embodiment 1 (the surface involving X-Y axis).
Figure 8:
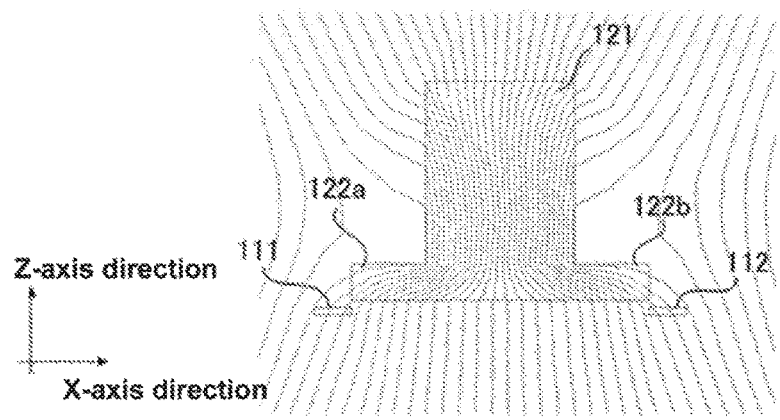
FIG. 8 is a schematic view showing the magnetic flux introduced to the GMR element part in Embodiment 1.
Figure 9:
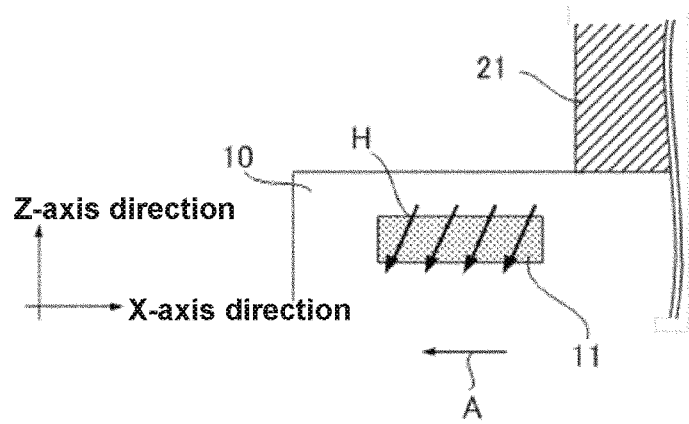
FIG. 9 is a view showing the enlarged GMR element part in the example of prior art.
Figure 10:
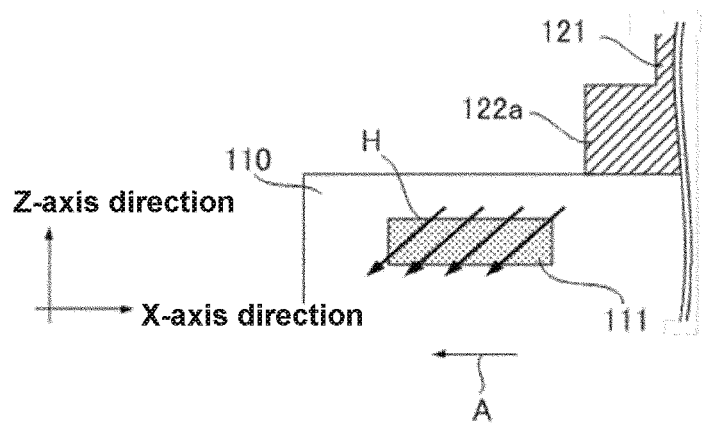
FIG. 10 is a view showing the enlarged GMR element part in Embodiment 1.
Figure 11:
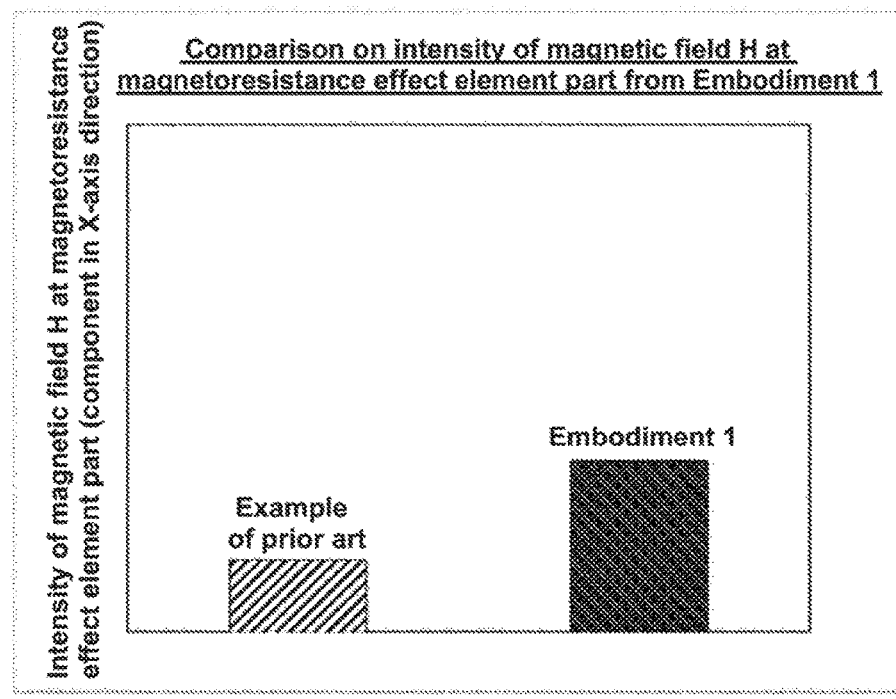
FIG. 11 shows the stimulation results in the example of prior art and Embodiment 1 about the intensity of the magnetic field in the magnetoresistance effect element part in the X-axis direction.

The first embodiment of the present invention will be described with reference to FIG. 6 to FIG. 11. FIG. 6 is a view showing the configuration of the magnetic sensor according to the present embodiment in the surface involving X-Z axis. FIG. 7 is a view showing the configuration of the magnetic sensor according to the present embodiment in the surface involving X-Y axis. FIG. 8 is a schematic view showing the magnetic field entering the GMR element part through the magnetic body in the present embodiment. FIG. 9 is a schematic view showing the magnetic field entering the GMR element part through the magnetic body in the example of prior art where the GMR element part is enlarged. FIG. 10 is a schematic view showing the magnetic field entering the GMR element part through the magnetic body in present embodiment where the GMR element part is enlarged. FIG. 11 shows the stimulation results according to the example of prior art and the present embodiment about the intensity of the magnetic field in the magnetoresistance effect element part in the X-axis direction.

[Configuration]

The shape of the soft magnetic body according to the present embodiment will be described with reference to FIG. 6 and FIG. 7. GMR elements 111 and 112 are formed in GMR chip 110. These GMR elements form a bridge circuit. In the vicinity of the bridge circuit, magnetic body 121 is provided which changes the direction of the magnetic field input to the magnetoresistance effect element. In addition, projection portions 122*a* and 122*b* are provided in the magnetic body 121 in the direction almost parallel to direction A in which the magnetic induction occurs in the magnetoresistance effect element.

Further, the end of magnetic body 121 in the X-axis direction of projection portion 122 is preferably provided closer to the center of magnetic body 121 (that is, interior side) than the end of GMR elements 111 and 112 at an opposite side to the center side of magnetic body in the X-axis direction. Further, the magnetic body and the magnetoresistance effect element preferably do not overlap in the direction perpendicular to the placement surface of the magnetoresistance effect elements.

Magnetic body 121 is the soft magnetic body made of the material such as the ferrite material, the permalloy (Ni—Fe alloy), Sendust (Fe—Si—Al alloy) or the like. The material is not restricted as long as magnetic body 121 can change the direction of magnetic field H mentioned above.

Magnetic body 121 is preferably composed of one component. However, as long as magnetic body 121 is capable of changing the direction of magnetic field H, the number of the components to constitute magnetic body 121 is not particularly restricted.

[Function]

Hereinafter, magnetic field H introduced to GMR element parts 111 and 112 through the configuration mentioned above will be described with reference to FIG. 8 to FIG. 10. Similar to that in the example of prior art, the magnetic field entering magnetic body 121 from the upper part of the figure in Z-axis direction is bended by magnetic body 121 and is introduced into the interior of magnetic body 121.

Magnetic field H introduced into the interior of magnetic body 121 moves towards the outside of the magnetic body 121 in the X-axis direction through the projecting shape in the vicinity of projection portion 122 of magnetic body 121.

In this way, the magnetically concentrated magnetic field H enters the vicinity of GMR elements 111 and 112, so the intensity of magnetic field to be detected is increased. Further, it can be seen from FIG. 9 and FIG. 10 where the GMR element parts from the example of prior art and the present example are enlarged that magnetic field H bends towards the X-axis direction to a larger extent in the present embodiment when the incidence angles of magnetic field H that enters to the GMR element part are compared. As such, with respect to magnetic field H entering GMR element 111, not only the intensity of the magnetic field is increased, but also the component of magnetic field H in X-axis increases due to the bending of magnetic field H with the effects from magnetic body 121 and projection portion 122*a*, wherein the magnetic induction occurs in the GMR element in the X-axis direction. Thus, the detection precision of the magnetic sensor can be improved. Although not shown, at the opposite side along X-axis, the same happens to magnetic field H entering GMR element 122 with the effects from magnetic body 121 and projection portion 122*b*. As a result, the component of magnetic field H in the X-axis direction increases so that the detection precision of the magnetic sensor can be improved, wherein the magnetic induction occurs in the GMR element in the X-axis direction.

With respect to FIG. 11, a simulation is performed to predict the intensity of magnetic field H introduced to GMR element parts 111 and 112 through the configuration mentioned above, and the result is described and compared against that from the example of prior art. It can be confirmed in Embodiment 1 that the intensity of magnetic field H introduced to GMR element parts 111 and 112 is denser compared to that in the example of prior art.

With the functions mentioned above, the detection precision of the magnetic sensor can be improved by increasing the intensity of the magnetic field introduced to the GMR element part.

(Embodiment 2)

Figure 12:
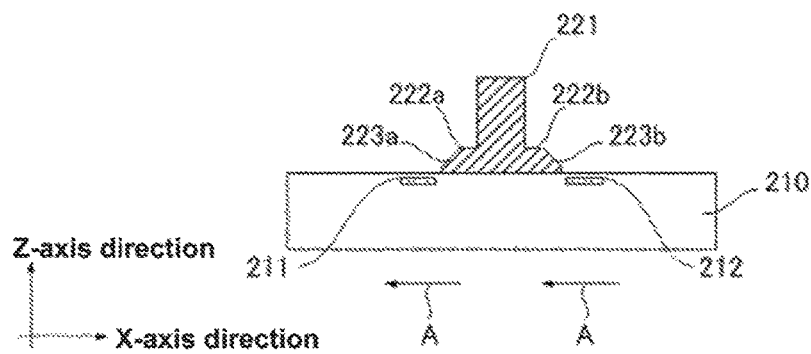
FIG. 12 is a view showing the configuration of the magnetic sensor in Embodiment 2 (the surface involving X-Z axis).
Figure 13:
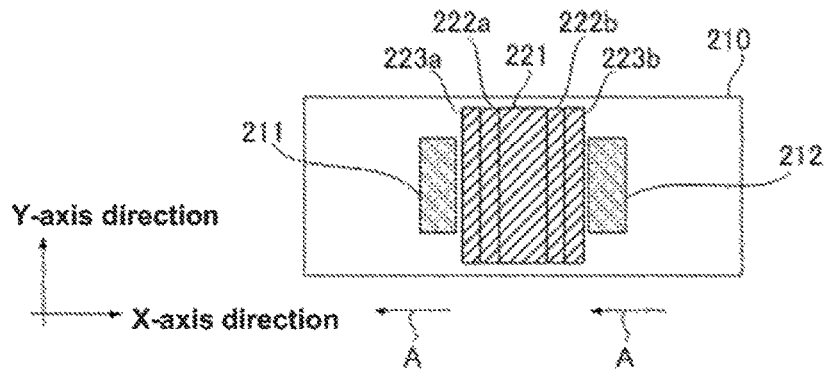
FIG. 13 is a view showing the configuration of the magnetic sensor in Embodiment 2 (the surface involving X-Y axis).
Figure 14:
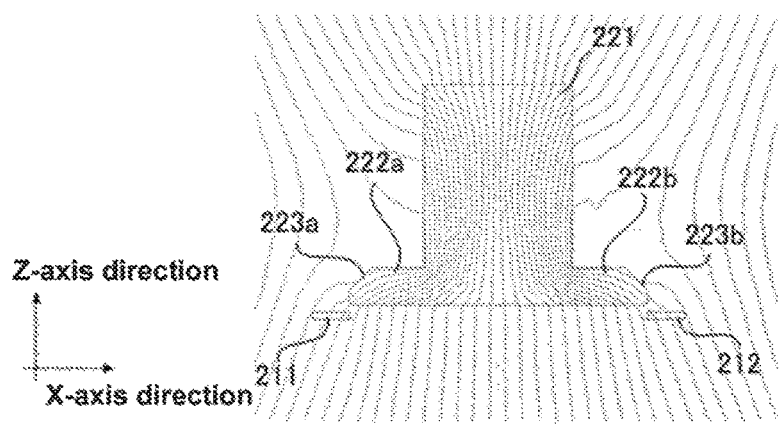
FIG. 14 is a schematic view showing the magnetic flux introduced to the GMR element part in Embodiment 2.
Figure 15:
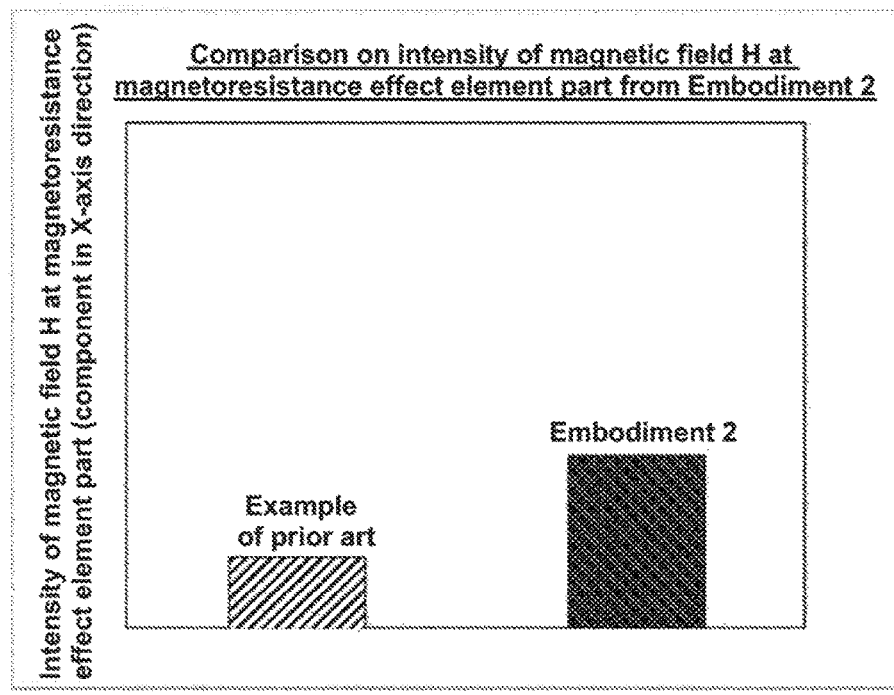
FIG. 15 shows the stimulation results in the example of prior art and Embodiment 2 about the intensity of the magnetic field in the magnetoresistance effect element part in the X-axis direction.

The second embodiment of the present invention will be described with reference to FIG. 12 to FIG. 15. FIG. 12 is a view showing the configuration of the magnetic sensor according to the present embodiment in the surface involving X-Z axis. FIG. 13 is a view showing the configuration of the magnetic sensor according to the present embodiment in the surface involving X-Y axis. FIG. 14 is a schematic view showing the magnetic field entering the GMR element part through the magnetic body in the present embodiment. FIG. 15 shows the stimulation results according to the example of prior art and the present embodiment about the intensity of the magnetic field in the magnetoresistance effect element part in the X-axis direction.

[Configuration]

The shape of the soft magnetic body according to the present embodiment will be described with reference to FIG. 12 and FIG. 13. GMR elements 211 and 212 are formed in GMR chip 210. These GMR elements form a bridge circuit. In the vicinity of the bridge circuit, magnetic body 221 is provided to change the direction of the magnetic field input to the magnetoresistance effect element. In addition, projection portions 222*a* and 222*b* are provided in magnetic body 121 in the direction almost parallel to direction A in which the magnetic induction occurs in the magnetoresistance effect element.

Further, chamfer parts 223*a* and 223*b* towards the placement surface of the GMR element are provided on the fore-ends of projection portion 222 in magnetic body 221.

Further, the end of magnetic body 221 in the X-axis direction of projection portion 222 is preferably provided closer to the center of magnetic body 221 (that is, interior side) than the end of GMR elements 211 and 212 at the opposite side to the center side of magnetic body in X-axis direction. Further, the magnetic body and the magnetoresistance effect element preferably do not overlap in the direction perpendicular to the placement surface of the magnetoresistance effect elements.

Magnetic body 221 is the soft magnetic body made of the material such as the ferrite material, the permalloy (Ni—Fe alloy), Sendust (Fe—Si—Al alloy) or the like. The material is not restricted as long as magnetic body 221 can change the direction of magnetic field H.

Magnetic body 221 is preferably composed of one component. However, as long as magnetic body 221 is capable of changing the direction of magnetic field H, the number of the components to constitute magnetic body 221 is not particularly restricted.

[Function]

Hereinafter, magnetic field H introduced to GMR element parts 211 and 212 through the configuration mentioned above will be described with reference to FIG. 14. Similar to that in the example of prior art, the magnetic field entering magnetic body 221 from the upper part of the figure in the Z-axis direction is bended by magnetic body 221 and is introduced into the interior of magnetic body 221.

Magnetic field H introduced into the interior of magnetic body 221 moves towards the outside of the magnetic body 221 in the X-axis direction through the projecting shape in the vicinity of projection portion 222 of magnetic body 221. Further, with the effect from chamfer parts 223a and 223b in the fore-end of the projection portion, magnetic field H is magnetically concentrated on the end of projection portion 222 in the Y-axis direction. In this way, the magnetically concentrated magnetic field H enters the vicinity of GMR elements 211 and 212, so the intensity of magnetic field to be detected is increased. Further, similar to Embodiment 1, magnetic field H entering the GMR element part bends towards X-axis direction to a large extent in the present embodiment, wherein the magnetic induction occurs in the GMR element in the X-axis direction. As such, with respect to magnetic field H entering GMR element 211, not only the intensity of the magnetic field is increased, but also the component of magnetic field H in the X-axis increases due to the bending of magnetic field H with the effects from magnetic body 221 and projection portion 222, wherein the magnetic induction occurs in the GMR element in the X-axis direction. Thus, the detection precision of the magnetic sensor can be improved.

With respect to FIG. 15, a simulation is performed to predict the intensity of magnetic field H introduced to GMR element parts 211 and 212 through the configuration mentioned above, and the result is described and compared against that from the example of prior art. It can be confirmed in Embodiment 2 that the intensity of magnetic field H introduced to GMR element parts 211 and 212 is denser compared to that in the example of prior art.

With the functions mentioned above, the detection precision of the magnetic sensor can be improved by increasing the intensity of the magnetic field introduced to the GMR element part.

(Embodiment 3)

Figure 16:
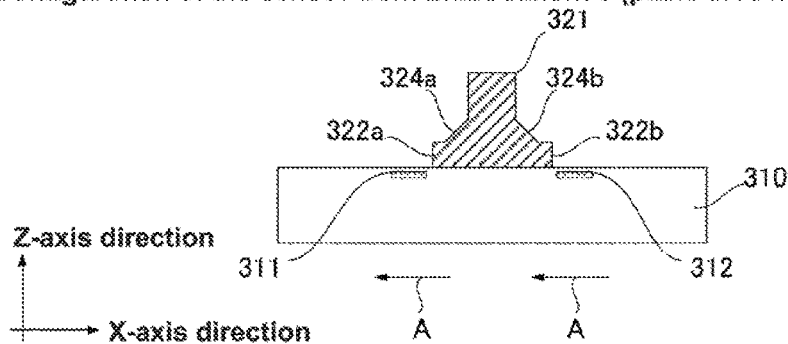
FIG. 16 is a view showing the configuration of the magnetic sensor in Embodiment 3 (the surface involving X-Z axis).
Figure 17:
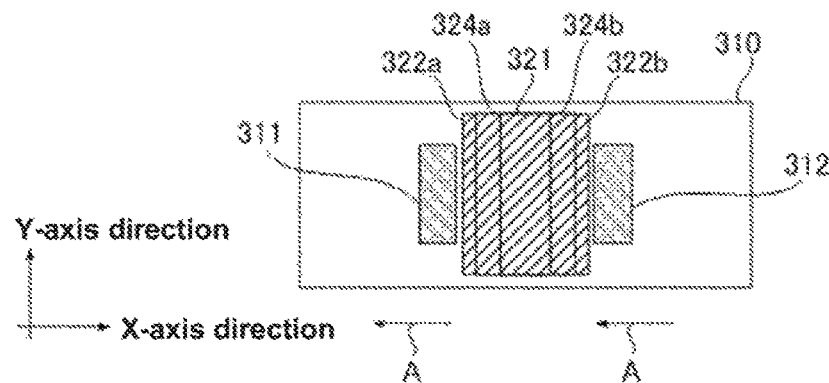
FIG. 17 is a view showing the configuration of the magnetic sensor in Embodiment 3 (the surface involving X-Y axis).
Figure 18:
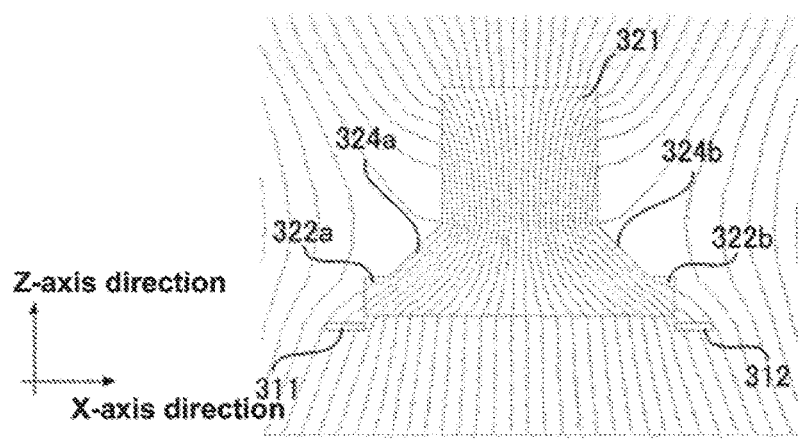
FIG. 18 is a schematic view showing the magnetic flux introduced to the GMR element part in Embodiment 3.
Figure 19:
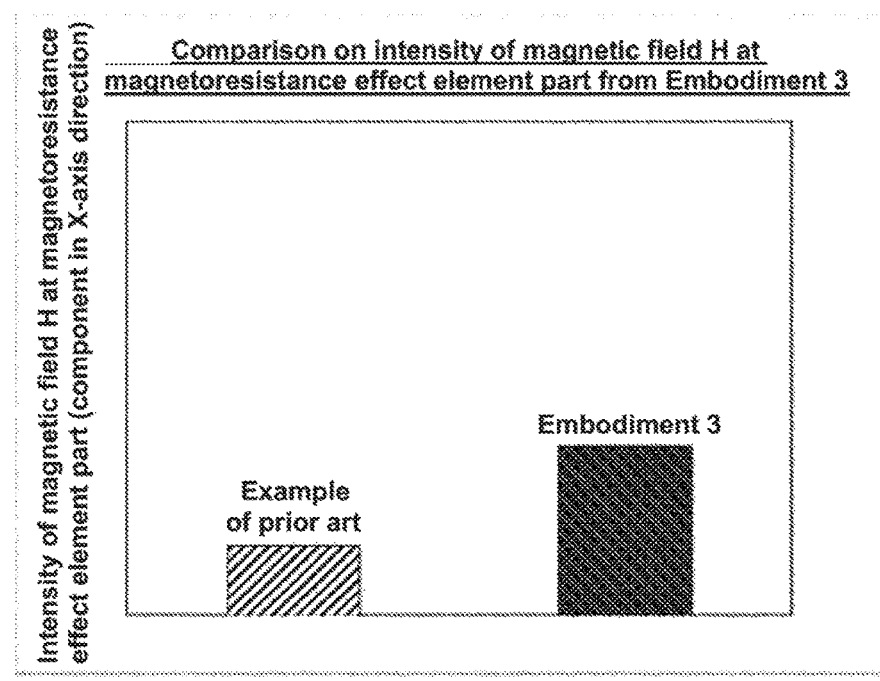
FIG. 19 shows the stimulation results in the example of prior art and Embodiment 3 about the intensity of the magnetic field in the magnetoresistance effect element part in the X-axis direction.

The third embodiment of the present invention will be described with reference to FIG. 16 to FIG. 19. FIG. 16 is a view showing the configuration of the magnetic sensor according to the present embodiment in the surface involving X-Z axis. FIG. 17 is a view showing the configuration of the magnetic sensor according to the present embodiment in the surface involving X-Y axis. FIG. 18 is a schematic view showing the magnetic field entering the GMR element part through the magnetic body in the present embodiment. FIG. 19 shows the stimulation results according to the example of prior art and the present embodiment about the intensity of the magnetic field in the magnetoresistance effect element part in the X-axis direction,

[Configuration]

The shape of the soft magnetic body according to the present embodiment will be described with reference to FIG. 16 and FIG. 17. GMR elements 311 and 312 are formed in GMR chip 310. These GMR elements form a bridge circuit. In the vicinity of the bridge circuit, magnetic body 321 is provided to change the direction of the magnetic field input to the magnetoresistance effect element. In addition, projection portions 322a and 322b are provided in magnetic body 321 in the direction almost parallel to direction A in which the magnetic induction occurs in the magnetoresistance effect element.

Further, magnetic body 321 and projection portion 322 are connected by slopping connection parts 324a and 324b in the projection portion.

Further, the end of magnetic body 321 in the X-axis direction of projection portion 322 is preferably provided closer to the center of magnetic body 321 (that is, interior side) than the end of GMR elements 311 and 312 at the opposite side to the center side of magnetic body in X-axis direction. Further, the magnetic body and the magnetoresistance effect element preferably do not overlap in the direction perpendicular to the placement surface of the magnetoresistance effect element.

Magnetic body 321 is the soft magnetic body made of the material such as the ferrite material, the permalloy (Ni—Fe alloy), Sendust (Fe—Si—Al alloy) or the like. The material is not restricted as long as magnetic body 321 can change the direction of magnetic field H.

Magnetic body 321 is preferably composed of one component. However, as long as magnetic body 321 is capable of changing the direction of magnetic field H, the number of the components to constitute magnetic body 321 is not particularly restricted.

[Function]

Hereinafter, magnetic field H introduced to GMR element parts 311 and 312 through the configuration mentioned above will be described with reference to FIG. 18. Similar to that in the example of prior art, the magnetic field entering magnetic body 321 from the upper part of the figure in the Z-axis direction is bended by magnetic body 321 and is introduced into the interior of magnetic body 321.

Magnetic field H introduced into the interior of magnetic body 321 moves towards the outside of the magnetic body 321 in the X-axis direction through the projecting shape in the vicinity of projection portion 322 of magnetic body 321. Further, with the effects from slopping connection parts 324a and 324b in the projection portion, magnetic field H is magnetically concentrated on the ends of projection portion 322 in the Y-axis direction. In this way, the magnetically concentrated magnetic field H enters the vicinity of GMR elements 311 and 312, so the intensity of magnetic field to be detected is increased. Further, similar to Embodiment 1, magnetic field H entering the GMR element part bends towards X-axis direction to a large extent in the present embodiment, wherein the magnetic induction occurs in the GMR element in the X-axis direction. As such, with respect to magnetic field H entering GMR element 311, not only the intensity of the magnetic field is increased, but also the component of magnetic field H in the X-axis increases due to the bending of magnetic field H with the effects from magnetic body 321 and projection portion 322, wherein the magnetic induction occurs in the GMR element in the X-axis direction. Thus, the detection precision of the magnetic sensor can be improved.

With respect to FIG. 19, a simulation is performed to predict the intensity of magnetic field H introduced to GMR element parts 311 and 312 through the configuration mentioned above, and the result is described and compared against that from the example of prior art. It can be confirmed in Embodiment 3 that the intensity of magnetic field H introduced to GMR element parts 311 and 312 is denser compared to that in the example of prior art.

With the functions mentioned above, the detection precision of the magnetic sensor can be improved by increasing the intensity of the magnetic field introduced to the GMR element part.

(Embodiment 4)

Figure 20:
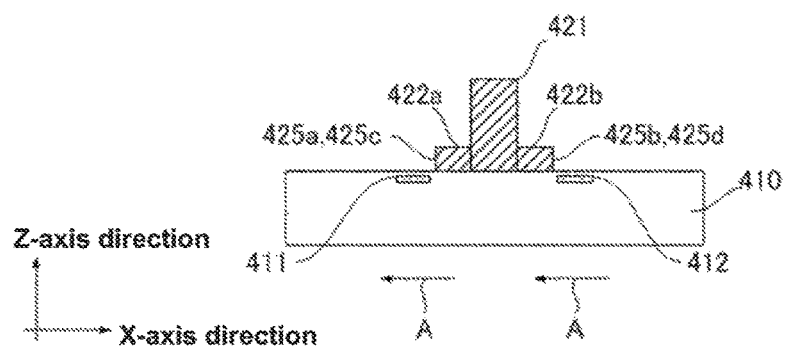
FIG. 20 is a view showing the configuration of the magnetic sensor in Embodiment 4 (the surface involving X-Z axis).
Figure 21:
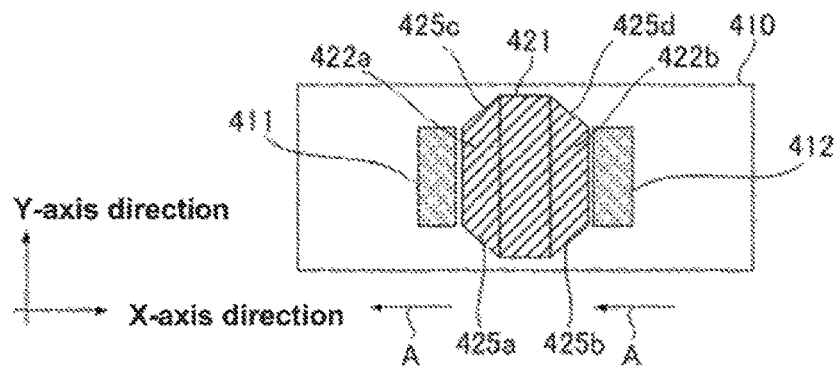
FIG. 21 is a view showing the configuration of the magnetic sensor in Embodiment 4 (the surface involving X-Y axis).
Figure 22:
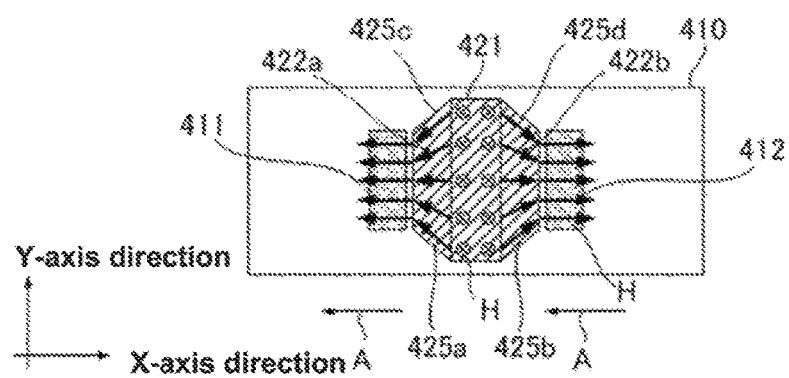
FIG. 22 is a schematic view showing the magnetic flux introduced to the GMR element part in Embodiment 4.
Figure 23:
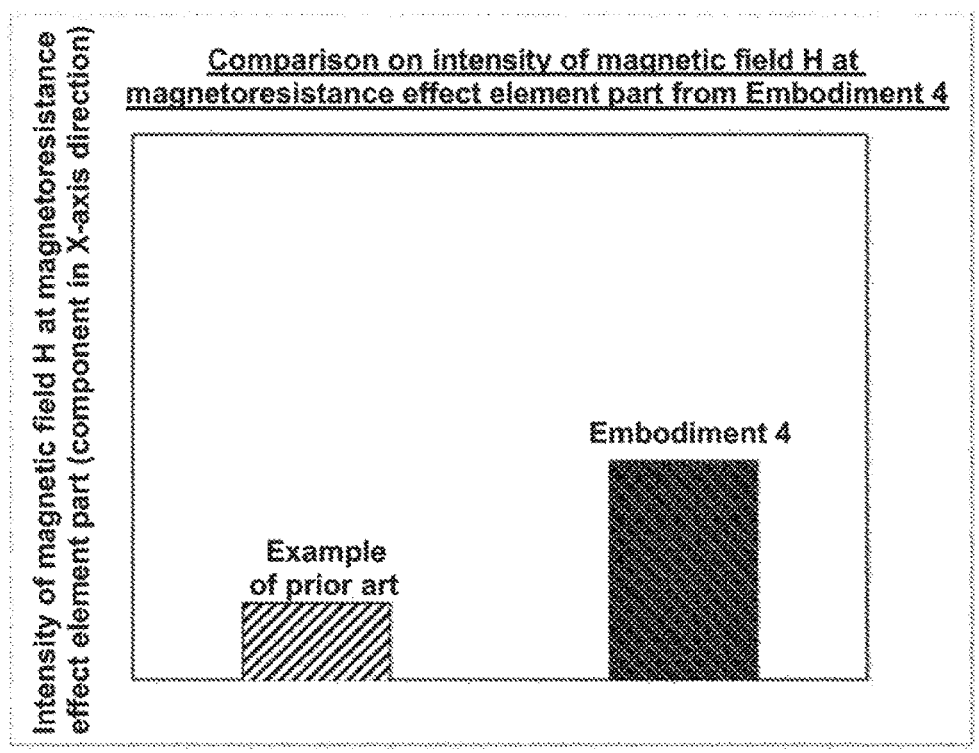
FIG. 23 shows the stimulation results in the example of prior art and Embodiment 4 about the intensity of the magnetic field in the magnetoresistance effect element part in the X-axis direction.

The fourth embodiment of the present invention will be described with reference to FIG. 20 to FIG. 23. FIG. 20 is a view showing the configuration of the magnetic sensor according to the present embodiment in the surface involving X-Z axis. FIG. 21 is a view showing the configuration of the magnetic sensor according to the present embodiment in the surface involving X-Y axis. FIG. 22 is a schematic view showing the magnetic field entering the GMR element part through the magnetic body in the present embodiment. FIG. 23 shows the stimulation results according to the example of prior art and the present embodiment about the intensity of the magnetic field in the magnetoresistance effect element part in the X-axis direction.

[Configuration]

The shape of the soft magnetic body according to the present embodiment will be described with reference to FIG. 20 and FIG. 21. GMR elements 411 and 412 are formed in GMR chip 410. These GMR elements form a bridge circuit. In the vicinity of the bridge circuit, magnetic body 421 is provided to change the direction of the magnetic field input to the magnetoresistance effect element. In addition, projection portions 422a and 422b are provided in magnetic body 421 in the direction almost parallel to direction A in which the magnetic induction occurs in the magnetoresistance effect element.

Further, restriction parts 425a, 425b, 425c and 425d towards the projecting direction of projection portion 422 in magnetic body 421 are provided at the fore-ends of projection portion 422 of magnetic body 421.

Further, the end of magnetic body 421 in the X-axis direction of projection portion 422 is preferably provided closer to the center of magnetic body 421 (that is, interior side) than the end of GMR elements 411 and 412 at the opposite side to the center side of magnetic body in X-axis direction. Further, the magnetic body and the magnetoresistance effect element preferably do not overlap in the direction perpendicular to the placement surface of the magnetoresistance effect element.

Magnetic body 421 is the soft magnetic body made of the material such as the ferrite material, the permalloy (Ni—Fe alloy), Sendust (Fe—Si—Al alloy) or the like. The material is not restricted as long as magnetic body 421 can change the direction of magnetic field H.

Magnetic body 421 is preferably composed of one component. However, as long as magnetic body 421 is capable of changing the direction of magnetic field H, the number of the components to constitute magnetic body 321 is not particularly restricted.

[Function]

Hereinafter, magnetic field H introduced to GMR element part 411 through the configuration mentioned above will be described with reference to FIG. 22. Similar to the example of prior art, the magnetic field entering magnetic body 421 from the upper part of the figure in the Z-axis direction is bended by magnetic body 421 and is introduced into the interior of magnetic body 421.

Magnetic field H introduced into the interior of magnetic body 421 moves towards the outside of the magnetic body 421 in the X-axis direction through the projecting shape in the vicinity of projection portion 422 of magnetic body 421. Further, with the effects from restriction parts 425a, 425b, 425c and 425d in fore-end of the projection portion, magnetic field H is magnetically concentrated on the ends of projection portion 422 in the Y-axis direction. In this way, the magnetically concentrated magnetic field H enters the vicinity of GMR elements 411 and 412, so the intensity of magnetic field to be detected is increased. Further, similar to Embodiment 1, magnetic field H entering the GMR element part bends towards X-axis direction to a large extent in the present embodiment, wherein the magnetic induction occurs in the GMR element in the X-axis direction. As such, with respect to magnetic field H entering GMR element 411, not only the intensity of the magnetic field is increased, but also the component of magnetic field H in the X-axis increases due to the bending of magnetic field H with the effects from magnetic body 421 and projection portion 422, wherein the magnetic induction occurs in the GMR element in the X-axis direction. Thus, the detection precision of the magnetic sensor can be improved.

With respect to FIG. 23, a simulation is performed to predict the intensity of magnetic field H introduced to GMR element parts 411 and 412 through the configuration mentioned above, and the result is described and compared against that from the example of prior art. It can be confirmed in Embodiment 4 that the intensity of magnetic field H introduced to GMR element parts 411 and 412 is denser compared to that in the example of prior art.

With the functions mentioned above, the detection precision of the magnetic sensor can be improved by increasing the intensity of the magnetic field introduced to the GMR element part.

(Embodiment 5)

Figure 24:
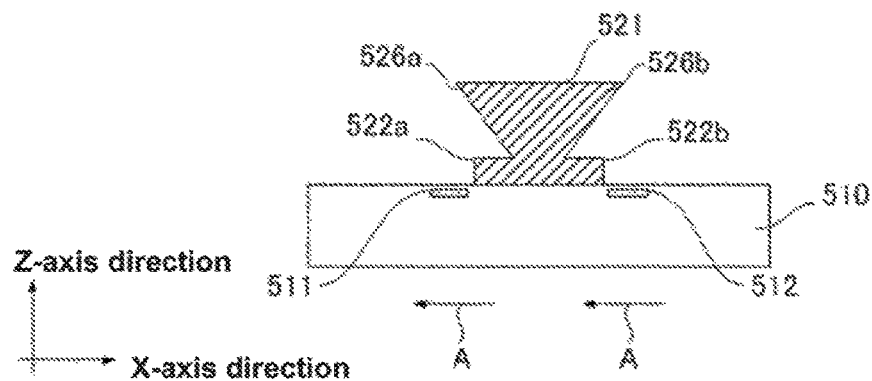
FIG. 24 is a view showing the configuration of the magnetic sensor in Embodiment 5 (the surface involving X-Z axis).
Figure 25:
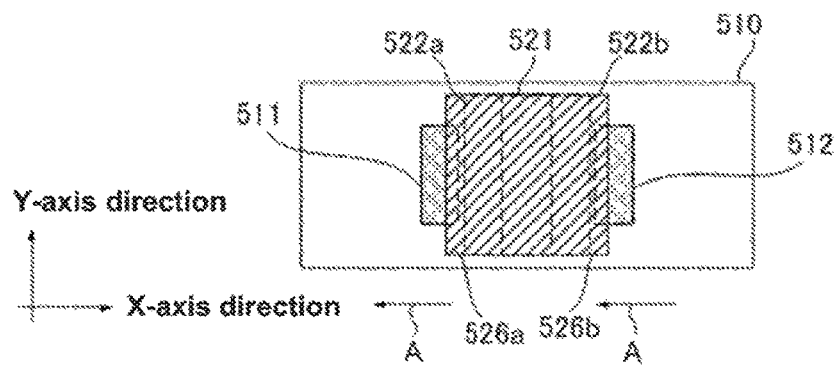
FIG. 25 is a view showing the configuration of the magnetic sensor in Embodiment 5 (the surface involving X-Y axis).
Figure 26:
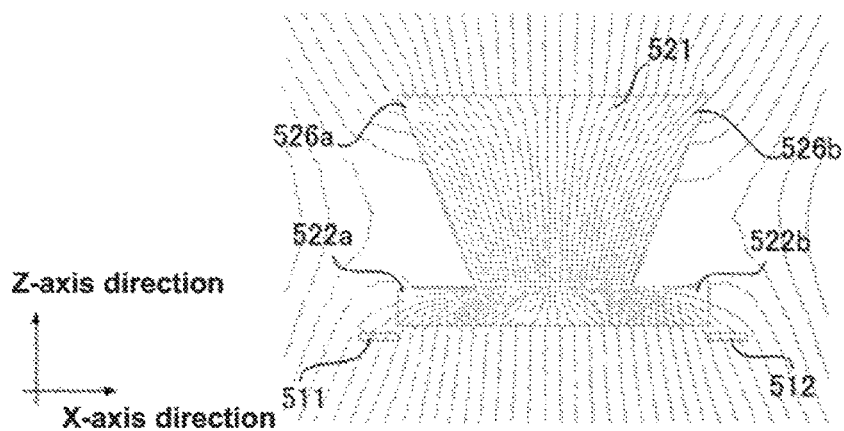
FIG. 26 is a schematic view showing the magnetic flux introduced to the GMR element part in Embodiment 5.
Figure 27:
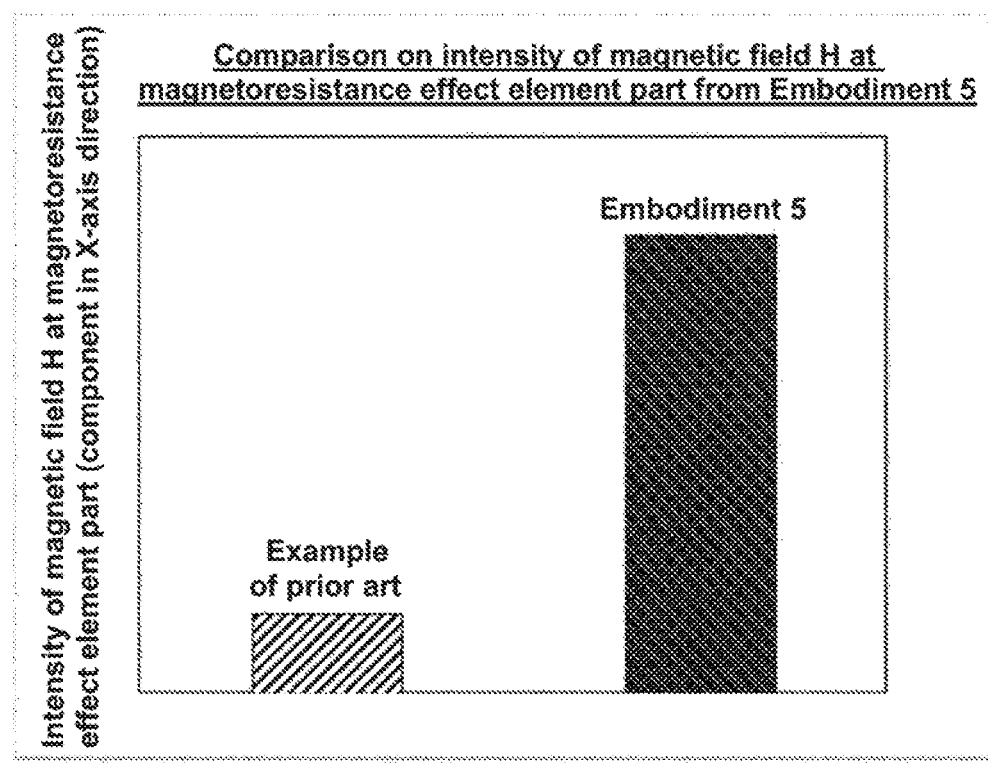
FIG. 27 shows the stimulation results in the example of prior art and Embodiment 5 about the intensity of the magnetic field in the magnetoresistance effect element part in the X-axis direction.

The fifth embodiment of the present invention will be described with reference to FIG. 24 to FIG. 27. FIG. 24 is a view showing the configuration of the magnetic sensor according to the present embodiment in the surface involving X-Z axis. FIG. 25 is a view showing the configuration of the magnetic sensor according to the present embodiment in the surface involving X-Y axis. FIG. 26 is a schematic view showing the magnetic field entering the GMR element part through the magnetic body in the present embodiment. FIG. 27 shows the stimulation results according to the example of prior art and the present embodiment about the intensity of the magnetic field in the magnetoresistance effect element part in the X-axis direction.

[Configuration]

The shape of the soft magnetic body according to the present embodiment will be described with reference to FIG. 24 and FIG. 25. GMR elements 511 and 512 are formed in GMR chip 510. These GMR elements form a bridge circuit. In the vicinity of the bridge circuit, magnetic body 521 is provided to change the direction of the magnetic field input to the magnetoresistance effect element. In addition, projection portions 522a and 522b are provided in magnetic body 521 in the direction almost parallel to direction A in which the magnetic induction occurs in the magnetoresistance effect element.

Further, magnetic body 521 contains slopping parts 526A and 526b. Based on the cross-sectional area in the surface involving X-Y axis, it can be sent that the slopping part is wider in the X-axis direction at the surface of magnetic body 521 opposite to that with projection portion 522 than the part where projection portion 522 begins to project. In addition, although not shown, slopping part 26 in magnetic body is not limited to the shape as shown in FIG. 24, wherein the length in the X-axis direction becomes longer gradually along the Z-axis direction. Also, other shapes can be used such as the one with the length in the Y-axis direction being longer gradually along the Z-axis direction, the one with the lengths in both the X-axis direction and the Y-axis direction being longer along the Z-axis direction, or the one with the length in the direction deviating from the X-axis direction or the Y-axis direction with a specific angle being longer along the Z-axis direction.

Further, the end of magnetic body 521 in the X-axis direction of projection portion 522 is preferably provided closer to the center of magnetic body 521 (that is, interior side) than the end of GMR elements 511 and 512 at the opposite side to the center side of magnetic body in X-axis direction. Further, the magnetic body and the magnetoresistance effect element preferably do not overlap in the direction perpendicular to the placement surface of the magnetoresistance effect element.

Magnetic body 521 is the soft magnetic body made of the material such as the ferrite material, the permalloy (Ni—Fe alloy), Sendust (Fe—Si—Al alloy) or the like. The material is not restricted as long as magnetic body 521 can change the direction of magnetic field H.

Magnetic body 521 is preferably composed of one component. However, as long as magnetic body 521 is capable of changing the direction of magnetic field H, the number of the components to constitute magnetic body 521 is not particularly restricted.

[Function]

Hereinafter, magnetic field H introduced to GMR element parts 511 and 512 through the configuration mentioned above will be described with reference to FIG. 26. Similar to that in the example of prior art, the magnetic field entering magnetic body 521 in the Z-axis direction from the upper part of the figure is bended by magnetic body 521 and is introduced into the interior of magnetic body 521.

Magnetic field H introduced into the interior of magnetic body 521 moves towards the outside of the magnetic body 521 in the X-axis direction through the projecting shape in the vicinity of projection portion 522 of magnetic body 521. Further, with the effect from slopping part 526 in the magnetic body, magnetic field H entering magnetic body 521 focuses in the center of magnetic body 521 in the X-axis direction as it goes towards projection portion 522. In this way, magnetic field H is strengthened. As such, magnetic field H focusing in the center of magnetic body 521 in the X-axis direction is magnetically concentrated on the ends of projection portion 522 in the Y-axis direction. Thus, the magnetically concentrated magnetic field H enters the vicinity of GMR elements 511 and 512, so the intensity of magnetic field to be detected is increased. Further, similar to Embodiment 1, magnetic field H entering the GMR element part bends towards X-axis direction to a large extent in the present embodiment, wherein the magnetic induction occurs in the GMR element in the X-axis direction. As such, with respect to magnetic field H entering GMR element 311, not only the intensity of the magnetic field is increased, but also the component of magnetic field H in the X-axis increases due to the bending of magnetic field H with the effects from magnetic body 521 and projection portion 522, wherein the magnetic induction occurs in the GMR element in the X-axis direction. Thus, the detection precision of the magnetic sensor can be improved.

With respect to FIG. 27, a simulation is performed to predict the intensity of magnetic field H introduced to GMR element parts 511 and 512 through the configuration mentioned above, and the result is described and compared against that from the example of prior art. It can be confirmed in Embodiment 5 that the intensity of magnetic field H introduced to GMR element parts 511 and 512 is denser compared to that in the example of prior art.

With the functions mentioned above, the detection precision of the magnetic sensor can be improved by increasing the intensity of the magnetic field introduced to the GMR element part.

INDUSTRIAL APPLICATION

The present invention can be applied to various measuring devices such as the magnetic sensor, the galvanometer and the encoder. Thus, the present invention can be utilized in the industry.

DESCRIPTION OF REFERENCE NUMERALS

1 GMR chip
10 GMR chip in example of prior art
11, 12 element disposing part in example of prior art
21 magnetic body in example of prior art
110 GMR chip in Embodiment 1
111, 112 element disposing part in Embodiment 1
121 magnetic body in Embodiment 1
122 projection portion in Embodiment 1
210 GMR chip in Embodiment 2
211, 212 element disposing part in Embodiment 2
221 magnetic body in Embodiment 2
222 projection portion in Embodiment 2
223 chamfer part in fore-end of projection portion in Embodiment 2
310 GMR chip in Embodiment 3
311, 312 element disposing part in Embodiment 3
321 magnetic body in Embodiment 3
322 projection portion in Embodiment 3
324 sloping connection part in projection portion of Embodiment 3
410 GMR chip in Embodiment 4
411, 412 element disposing part in Embodiment 4
421 magnetic body in Embodiment 4
422 projection portion in Embodiment 4
425 restriction part in fore-end of projection portion in Embodiment 4
510 GMR chip in Embodiment 5
511, 512 element disposing part in Embodiment 5
521 magnetic body in Embodiment 5
522 projection portion in Embodiment 5
526 slopping part in magnetic body of Embodiment 5
A fixed direction of magnetization
H mangetic field

What is claimed is:
1. A magnetic sensor comprising a magnetoresistance effect element and a magnetic body which is provided in the vicinity of the magnetoresistance effect element, wherein the magnetic body changes the direction of a magnetic field input to the magnetoresistance effect element, the resistance value of the magnetoresistance effect element changes according to the direction of the input magnetic field, and the magnetic body has at least one projection portion.

2. The magnetic sensor according to claim 1, wherein, the direction in which the projection portion of the magnetic body projects is substantially parallel to the direction in which the magnetization of the magnetoresistance effect element is fixed.

3. The magnetic sensor according to claim 1, wherein, the end of the magnetic body in the direction in which the projection portion projects is disposed closer to a central side of the magnetic body than the end of the magnetoresistance effect element at a side opposite to the central side of the magnetic body in the direction in which the projection portion projects.

4. The magnetic sensor according to claim 1, wherein, at least a part of the projection portion of the magnetic body contacts with the placement surface of the magnetic body.

5. The magnetic sensor according to claim 1, wherein, the magnetic body is a soft magnetic body.

6. The magnetic sensor according to claim 2, wherein, the end of the magnetic body in the direction in which the projection portion projects is disposed closer to a central side of the magnetic body than the end of the magnetoresistance effect element at a side opposite to the central side of the magnetic body in the direction in which the projection portion projects.

7. The magnetic sensor according to claim 2, wherein, at least a part of the projection portion of the magnetic body contacts with the placement surface of the magnetic body.

8. The magnetic sensor according to claim 3, wherein, at least a part of the projection portion of the magnetic body contacts with the placement surface of the magnetic body.

9. The magnetic sensor according to claim 6, wherein, at least a part of the projection portion of the magnetic body contacts with the placement surface of the magnetic body.

10. The magnetic sensor according to claim 2, wherein, the magnetic body is a soft magnetic body.

11. The magnetic sensor according to claim 3, wherein, the magnetic body is a soft magnetic body.

12. The magnetic sensor according to claim 6, wherein, the magnetic body is a soft magnetic body.

13. The magnetic sensor according to claim 4, wherein, the magnetic body is a soft magnetic body.

14. The magnetic sensor according to claim 7, wherein, the magnetic body is a soft magnetic body.

15. The magnetic sensor according to claim 8, wherein, the magnetic body is a soft magnetic body.

16. The magnetic sensor according to claim 9, wherein, the magnetic body is a soft magnetic body.

* * * * *